United States Patent
Li et al.

(10) Patent No.: US 12,278,164 B1
(45) Date of Patent: Apr. 15, 2025

(54) CHIP COOLING PLATFORM BASED ON MICRO-NANO STRUCTURE

(71) Applicant: GUANGDONG OCEAN UNIVERSITY, Zhanjiang (CN)

(72) Inventors: Haowei Li, Zhanjiang (CN); Weijun Feng, Zhanjiang (CN); Zehao Lu, Zhanjiang (CN); Zeming Chen, Zhanjiang (CN); Runji Xie, Zhanjiang (CN); Wenguan Li, Zhanjiang (CN)

(73) Assignee: GUANGDONG OCEAN UNIVERSITY, Zhanjiang (CN)

( * ) Notice: Subject to any disclaimer, the term of this patent is extended or adjusted under 35 U.S.C. 154(b) by 0 days.

(21) Appl. No.: 18/976,344

(22) Filed: Dec. 11, 2024

Related U.S. Application Data

(63) Continuation of application No. PCT/CN2024/131445, filed on Nov. 12, 2024.

(30) Foreign Application Priority Data

Jan. 10, 2024 (CN) .......................... 202410033073.4

(51) Int. Cl.
*H01L 23/473* (2006.01)
*H01L 23/373* (2006.01)
*H01L 23/427* (2006.01)

(52) U.S. Cl.
CPC ........ *H01L 23/473* (2013.01); *H01L 23/3736* (2013.01); *H01L 23/427* (2013.01)

(58) Field of Classification Search
CPC ....... H01L 23/473; H01L 23/46; H01L 23/42; H01L 23/373; H01L 23/38; H01L 23/367; H01L 23/3736; H01L 23/427; H01L 23/4332; H01L 23/4338; H01L 23/3732; H01L 23/3733; H01L 23/3735; H01L 23/3737; H01L 23/3738; H01L 23/445
See application file for complete search history.

(56) References Cited

U.S. PATENT DOCUMENTS 9,803,938 B2 * 10/2017 Joshi ................... H01L 23/4735
2005/0211427 A1 * 9/2005 Kenny ................ F28D 15/0266
165/299

(Continued)

FOREIGN PATENT DOCUMENTS

CN 113556914 A 10/2021
CN 116581094 A 8/2023

OTHER PUBLICATIONS

Sun Bin et al., "Numerical Simulation of the Intensified Heat Exchange of a Nano-fluid inside a Foam Metal Tube", Journal of Engineering for Thermal Energy and Power, Sep. 2016, pp. 9-14 and 129-130, vol. 31, No. 9.

*Primary Examiner* — Moazzam Hossain

(57) ABSTRACT

The disclosure discloses a chip cooling platform based on micro-nano structure, including a platform body, a cooling pipeline and an outer heat dissipation device, where the cooling pipeline is in a closed-loop structure, and part of the cooling pipeline is arranged in the platform body; the cooling pipeline is filled with cooling medium, and an inner wall of the cooling pipeline located in the platform body is provided with a turbulence structure; and a unidirectional hydraulic pump I is installed on the cooling pipeline arranged outside the platform body; the outer heat dissipation device is used for radiating the cooling medium in the cooling pipeline.

3 Claims, 4 Drawing Sheets

(56) References Cited

U.S. PATENT DOCUMENTS

| | | | |
|---|---|---|---|
| 2017/0092565 A1* | 3/2017 | Chen | H05K 7/20281 |
| 2022/0375817 A1* | 11/2022 | Berntson | H01L 23/3733 |
| 2023/0207426 A1* | 6/2023 | Yaglioglu | H05K 7/20281 |
| | | | 257/714 |

* cited by examiner

CHIP COOLING PLATFORM BASED ON MICRO-NANO STRUCTURE

TECHNICAL FIELD

The disclosure relates to the technical field of chip heat dissipation, and in particular to a chip cooling platform based on micro-nano structure.

BACKGROUND

Regarding liquid cooling technology, the current approach for chip heat sinks predominantly relies on the circulation of a cooling medium within a system of conduits to transfer heat away from the chip via a cold plate. Nevertheless, both flat and round tubes encounter issues with significant contact angles and suboptimal wettability between the cooling medium and the chip's heat exchange material. These factors can, to a certain extent, impair the overall heat exchange efficiency. Furthermore, as science and technology advance at a swift pace, the integration density of integrated circuits is increasing, leading to a reduction in the size of electronic devices. Concurrently, the demands placed on heat sinks are becoming more stringent, necessitating continuous improvements in their design and performance. Currently, heat dissipation devices available in the market are constrained by manufacturing technology, resulting in several challenges, including bulky designs, low material utilization rates, reduced effective heat dissipation areas, and subpar heat dissipation efficiency. Therefore, the heat dissipation device must meet the requirements of efficient heat dissipation while also being compact, having a high material utilization rate, a large effective heat dissipation area, and high heat dissipation efficiency. Therefore, the development of a innovative, efficient, and compact heat dissipation device is urgently needed.

SUMMARY

The disclosure aims to provide a chip cooling platform based on micro-nano structure, so as to solve the problems existing in the prior art.

In order to achieve the above objectives, the present disclosure provides a chip cooling platform based on micro-nano structure, including:
  a platform body;
  a cooling pipeline, where the cooling pipeline is in a closed-loop structure, and part of the cooling pipeline is arranged in the platform body; the cooling pipeline is filled with cooling medium, and an inner wall of the cooling pipeline located in the platform body is provided with a turbulence structure, and a unidirectional hydraulic pump I is installed on the cooling pipeline arranged outside the platform body;
  and an outer heat dissipation device, where the outer heat dissipation device is used for radiating the cooling medium in the cooling pipeline.

Optionally, the turbulence structure includes a plurality of micro-nano protrusions arranged on the inner wall of the cooling pipeline, and the micro-nano protrusions are arranged at equal intervals along a circumferential direction of the cooling pipeline, and the micro-nano protrusions are staggered along an axial direction of the cooling pipeline.

Optionally, the micro-nano protrusions are foam metal.

Optionally, arrangement angle directions of two adjacent micro-nano protrusions are opposite.

Optionally, the cooling medium is liquid metal.

Optionally, the cooling pipeline arranged in the platform body has a serpentine structure.

Optionally, the disclosure further includes:
  a connecting pipeline, where the connecting pipeline is arranged at the outer side of the platform body, and both ends of the connecting pipeline are installed on the cooling pipeline through a three-way valve; the connecting pipeline is provided with a unidirectional hydraulic pump II, and the unidirectional hydraulic pump II is arranged in parallel with the aforementioned unidirectional hydraulic pump I;
  a temperature measuring component, where the temperature measuring component is arranged on the cooling pipeline at an outlet end of the platform body, and the temperature measuring component is used for measuring temperature of the cooling medium in the cooling pipeline; and
  a control motor, where the control motor is used for controlling the opening and closing and the flow direction of the three-way valve, and the temperature measuring component is electrically connected with the control motor.

Optionally, the temperature measuring component is a thermometer.

Optionally, the outer heat dissipation device includes a heat dissipation pipeline, both ends of the heat dissipation pipeline are communicated with the cooling pipeline, and an evaporator, a compressor, a condenser and an expansion valve are sequentially arranged on the heat dissipation pipeline along a circulation direction of the cooling medium, and the heat dissipation pipeline at an outlet end of the expansion valve is communicated with the cooling pipeline through the evaporator.

Optionally, the platform body includes:
  wallboards; and
  heat-conducting components, where the heat-conducting components are fixedly installed on inner walls of the wallboards, the heat-conducting component includes a heat dissipation thin plate, a T4 copper plate and heat-conducting silicone grease in sequence, and the cooling pipeline is arranged between two groups of heat-conducting components, and the cooling pipeline is in contact and fit with the heat dissipation thin plate.

Compared with the prior art, the disclosure has the following advantages and technical effects:
  first, compared to conventional liquid cooling heat dissipation technology with working medium water as refrigerating medium, the disclosure leverages the inherent properties of liquid metals, offering high thermal conductivity and low viscosity, and is capable of reducing thermal resistance and thermal stress, the heat exchange is effective, rapid, and the duration is short;
  second, compared with the conventional liquid heat dissipation pipeline, the present disclosure uses the foam metal material to arrange an appropriate amount of micro-nano protrusions in the cooling pipeline to destroy the laminar flow area of the fluid, so that the cooling medium in the cooling pipeline is kept in a turbulent state, and heat exchange is enhanced; at the same time, the foam metal has a small density, a high porosity, and a micro-nano structure, so that the contact angle of the cooling fluid is reduced, and the wetting performance and permeability are enhanced while the light weight is ensured;
  third, utilizing liquid metal as the refrigerating medium, the heat dissipation device is capable of achieving a reduction in occupied space without altering the effective heat dissipation area, thereby enabling the miniaturization; the close arrangement of adjacent serpentine channels improves the utilization rate of space, makes the pipeline contact the chip on all sides, and strengthens the heat exchange performance; and forth, by controlling the switch of the three-way valve and the unidirectional hydraulic pumps, the liquid metal continues to circulate in the cooling pipeline in the cooling platform to cool the chip, even at relatively low temperatures; after the liquid metal reaches the temperature to be cooled, the flow direction of the three-way valve is controlled, so that the liquid metal flows out of the cooling pipeline and flows into the outer heat dissipation device for cooling, so as to achieve the effects of efficient cooling, energy saving and emission reduction.

BRIEF DESCRIPTION OF THE DRAWINGS

In order to explain the embodiments of the present disclosure or the technical scheme in the prior art more clearly, the drawings needed in the embodiments will be briefly introduced below. Obviously, the drawings described below are only some embodiments of the present disclosure, and other drawings can be obtained according to these drawings without creative work for ordinary people in the field.

In the figures: 1. platform body; 2. compressor; 3. condenser; 4. expansion valve; 5. thermometer; 6. evaporator; 7. control motor; 8. cooling pipeline; 9. micro-nano protrusion; 10. wallboard; 11. heat dissipation thin plate; 12. T4 copper plate; 13. heat-conducting silicone grease; 14. unidirectional hydraulic pump I; 15. unidirectional hydraulic pump II; and 16. three-way valve.

DETAILED DESCRIPTION OF THE EMBODIMENTS

It should be noted that the embodiments in the present disclosure and the features in the embodiments can be combined with each other without conflict. The described embodiment is only a part of the embodiment of the present disclosure, not the whole embodiment. All other embodiments obtained by ordinary people in the field without creative work belong to the scope of protection of the present disclosure. The present disclosure will be described in detail with reference to the attached drawings and examples.

Figure 1:
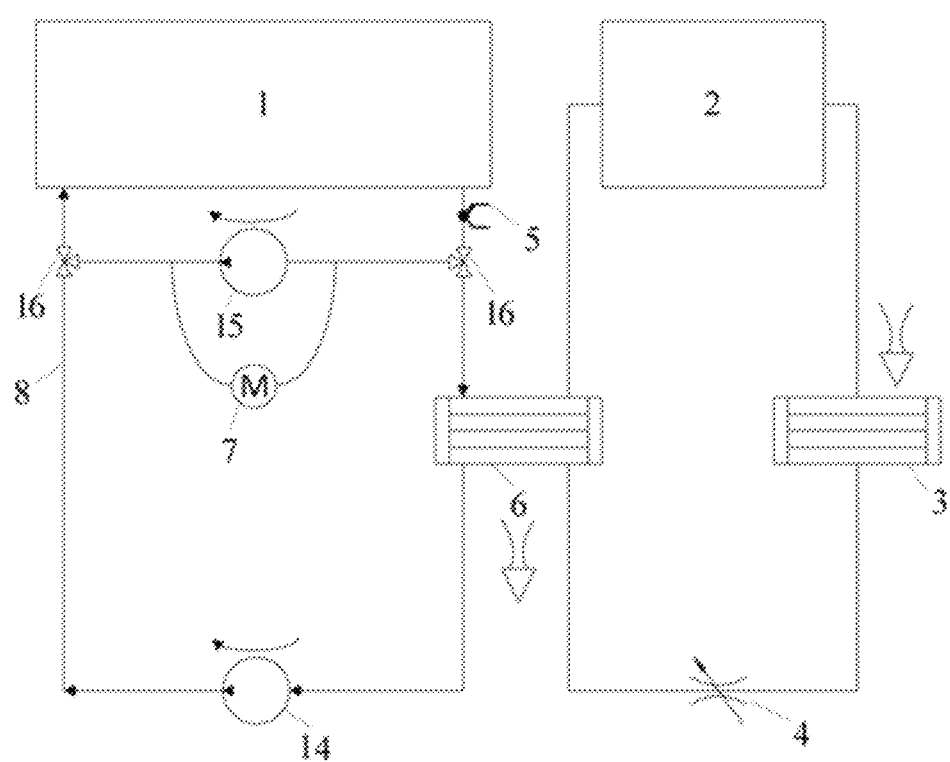
FIG. 1 is a cooling flow chart of the chip cooling platform according to the present disclosure.

The disclosure provides a chip cooling platform based on a micro-nano structure, which includes:

a platform body 1;

as shown in FIG. 1, a cooling pipeline 8, where the cooling pipeline 8 is in a closed-loop structure, and part of the cooling pipeline 8 is arranged in the platform body 1; the cooling pipeline 8 is filled with a cooling medium, and an inner wall of the cooling pipeline 8 located in the platform body 1 is provided with a turbulence structure; and a unidirectional hydraulic pump I 14 is installed on the cooling pipeline 8 arranged outside the platform body 1;

and an outer heat dissipation device, where the outer heat dissipation device is used for radiating the cooling medium in the cooling pipeline 8.

Figure 2:
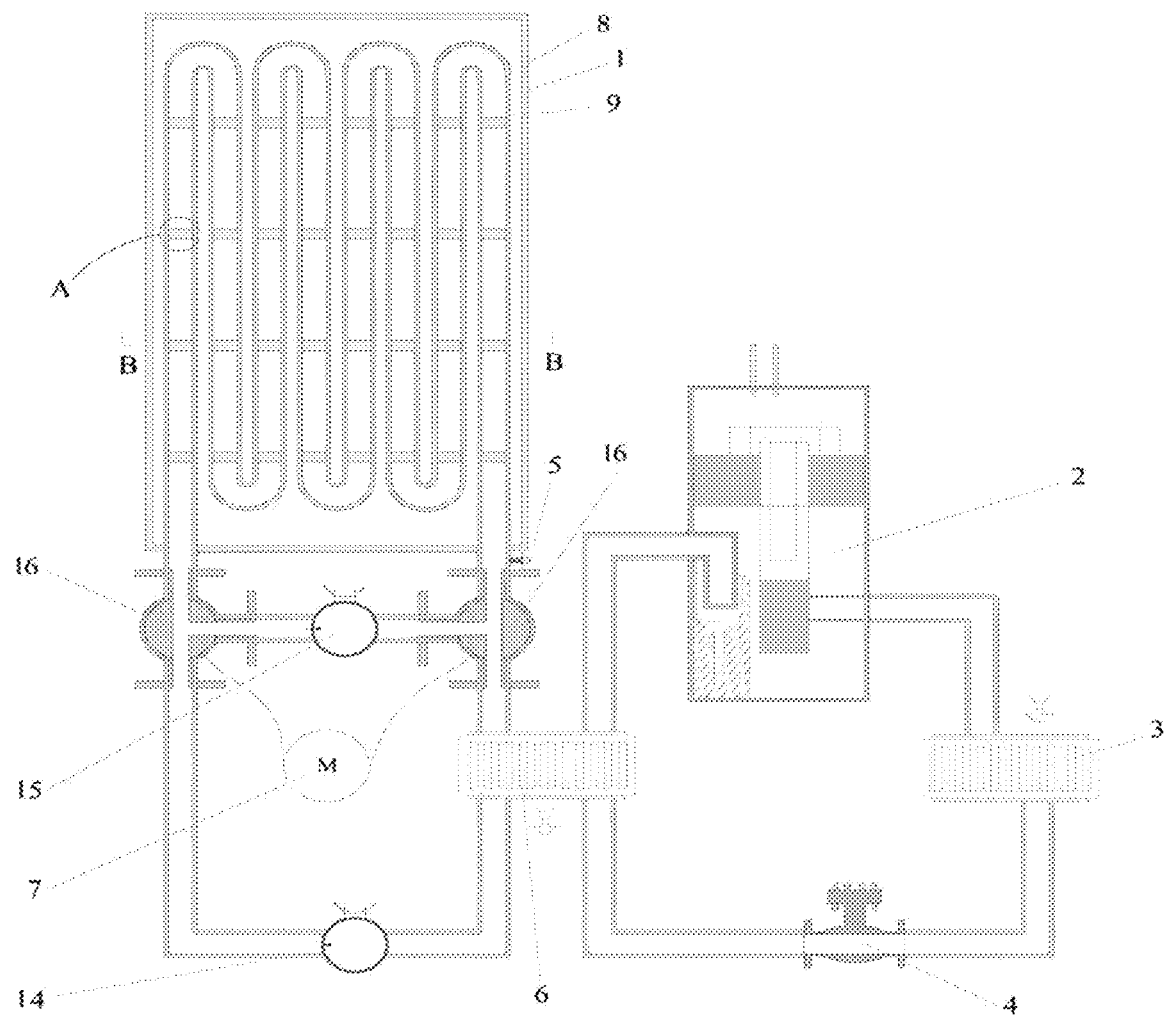
FIG. 2 is a schematic plan view of the chip cooling platform according to the present disclosure.

The disclosure destroys the laminar flow state of the cooling medium through the arrangement of the turbulence structure, and at the same time, the turbulence structure can enhance the disturbance of the cooling medium, enhance the convection between the cooling mediums, keep them in a turbulent state in the cooling pipeline 8, reduce the contact angle of the cooling medium, and achieve the purpose of enhancing heat exchange, and the specific process is shown in FIG. 2.

Further, as shown in FIG. 2, the turbulence structure includes a plurality of micro-nano protrusions 9 arranged on the inner wall of the cooling pipeline 8, and the micro-nano protrusions 8 are arranged at equal intervals along a circumferential direction of the cooling pipeline 8, and the micro-nano protrusions 9 are staggered along an axial direction of the cooling pipeline 8; the micro-nano protrusions 9 are foamed metal, and arrangement angle directions of two adjacent micro-nano protrusions 9 are opposite.

Figure 3:
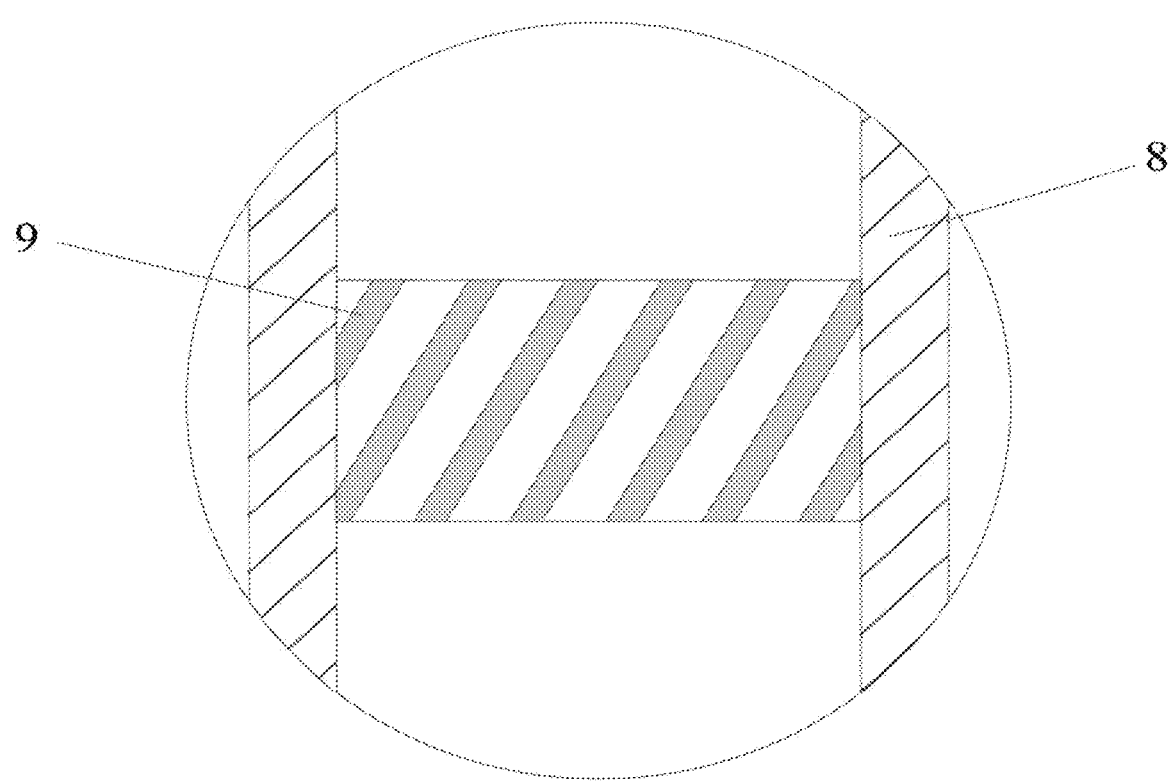
FIG. 3 is a partial enlarged view of A in FIG. 2.

The micro-nano protrusions 9 are connected by many tiny metal particles, forming a complex three-dimensional network structure, the specific structure is shown in FIG. 3; the micro-nano protrusions 9 effectively increase the surface area and turbulence degree of the tube wall, thus improving the heat transfer coefficient; by changing the shape and arrangement of micro-nano protrusions 9, the laminar bottom layer of cooling fluid on the pipe wall is destroyed by using the porous and porous characteristics of foam metal. Meanwhile, the micro-nano protrusions 9 have good thermal conductivity and mechanical strength, and can be closely combined with the pipe wall, thus ensuring the stability and reliability of the cooling medium. At the same time, the low density and weight characteristics of micro-nano protrusions 9 are used to reduce the burden and cost of the chip cooling and heat dissipation system.

Further, the cooling medium is liquid metal.

Using liquid metal as refrigerating medium has the characteristics of high thermal conductivity, low viscosity and low thermal resistance.

Further, the cooling pipeline 8 arranged in the platform body 1 has a serpentine structure, as shown in FIG. 2.

Further, the disclosure also includes:

a connecting pipe, where the connecting pipeline is arranged at the outer side of the platform body 1, and both ends of the connecting pipe are installed on the cooling pipeline 8 through a three-way valve 16; the connecting pipeline is provided with a unidirectional hydraulic pump II 15, and the unidirectional hydraulic pump II 15 is arranged in parallel with the aforementioned unidirectional hydraulic pump I 14;

a temperature measuring component, where the temperature measuring component is arranged on the cooling pipeline 8 at an outlet end of the platform body 1, and the temperature measuring component is used for measuring temperature of the cooling medium in the cooling pipeline 8; and a control motor 7, where the control motor is used for controlling the opening and closing and the flow direction of the three-way valve 16, and the temperature measuring component is electrically connected with the control motor 7.

Further, the temperature measuring component is a thermometer 5.

Further, the outer heat dissipation device includes a heat dissipation pipeline, both ends of the heat dissipation pipeline are communicated with the cooling pipeline 8, and an evaporator 6, a compressor 2, a condenser 3 and an expansion valve 4 are sequentially arranged on the heat dissipation pipe along a circulating direction of the cooling medium, and the heat dissipation pipeline at an outlet end of the expansion valve 4 is communicated with the cooling pipeline 8 through the evaporator 6.

Figure 4:
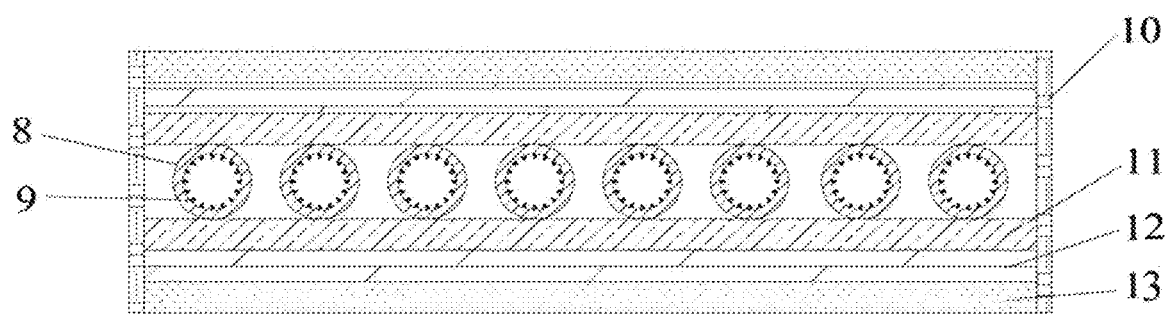
FIG. 4 is a sectional view taken along the direction B-B in FIG. 2.

Further, the platform body 1 includes:
wallboards 10; and
heat-conducting components, where the heat-conducting components are fixedly installed on inner walls of the wallboards 10, the heat-conducting component includes a heat dissipation thin plate 11, a T4 copper plate 12 and heat-conducting silicone grease 13 in sequence, and the cooling pipeline 8 is arranged between two groups of heat-conducting components, and the cooling pipeline 8 is in contact and fit with the heat dissipation thin plate 11, the specific structure is shown in FIG. 4.

A chip cooling platform based on micro-nano structure provided by the disclosure has the following working principles: when liquid metal flows into the platform body 1 through the cooling pipeline 8 and starts to work, the unidirectional hydraulic pump II 15 is turned on by controlling the flow direction of the three-way valve 16, so that the liquid metal with excellent cooling performance can be cooled in the cooling pipeline 8 and the heat dissipation pipeline in a reciprocating manner. During circulating cooling, the micro-nano protrusions 9 arranged in the cooling pipeline 8 destroy the laminar flow state of liquid metal, and at the same time, the arrangement of the micro-nano protrusions 9 enhances the disturbance of liquid metal, enhances the convection between liquid metals, keeps them in a turbulent state in the cooling pipeline 8, reduces the contact angle of cooling fluid, and achieves the purpose of enhancing heat exchange.

The thermometer 5 is used to measure the temperature of the liquid metal flowing out of the cooling platform once, and at the same time, the temperature measurement result is fed back to the control motor 7. When the temperature detected by the program in the control motor 7 reaches the threshold set by the program, the flow direction of the three-way valve 16 is controlled, and the liquid metal with higher temperature after circulation is radiated by the outer heat dissipation device. When the heat radiation of the liquid metal is finished, the liquid metal with the cooling effect is re-introduced into the cooling pipeline 8 by starting the unidirectional hydraulic pump 14, and the chips in the cooling platform are circularly cooled again.

When the thermometer 5 detects that the liquid metal flowing out does not reach the set threshold temperature, the liquid metal with good cooling performance is refluxed into the connecting pipeline by controlling the flow direction of the three-way valve 16, and the unidirectional hydraulic pump II 15 is started to re-introduce the liquid metal into the cooling pipeline 8 to continue working, so as to achieve the purposes of full heat exchange and efficient cooling.

Compared with the conventional common pipeline with liquid heat dissipation, the present disclosure arranges a proper number of micro-nano protrusions 9 in the flow channel by using the foam metal material, and destroys the laminar flow region of the fluid through the arrangement direction of the micro-nano protrusions 9, so as to keep the liquid metal in the cooling pipeline 8 in a turbulent state and enhance the heat exchange. At the same time, the low density and high porosity of foam metal and its micro-nano structure can reduce the contact angle of liquid metal, ensure light weight and enhance wettability and permeability. By judging the temperature of liquid metal, the utilization efficiency of liquid metal is greatly improved, and the purpose of energy saving and emission reduction is achieved.

The above is only the preferred embodiment of this disclosure, but the protection scope of this disclosure is not limited to this. Any change or replacement that can be easily thought of by a person familiar with this technical field within the technical scope disclosed in this disclosure should be included in the protection scope of this disclosure. Therefore, the protection scope of this disclosure should be based on the protection scope of the claims.

What is claimed is:

1. A chip cooling platform based on micro-nano structure, comprising:
   a platform body (1);
   a cooling pipeline (8), wherein the cooling pipeline (8) is in a closed-loop structure, and part of the cooling pipeline (8) is arranged in the platform body (1); the cooling pipeline (8) is filled with cooling medium, the cooling medium is liquid metal, and an inner wall of the cooling pipeline (8) located in the platform body (1) is provided with a turbulence structure; and a unidirectional hydraulic pump I (14) is installed on the cooling pipeline (8) arranged outside the platform body (1);
   and an outer heat dissipation device, wherein the outer heat dissipation device is used for radiating the cooling medium in the cooling pipeline (8);
   the turbulence structure comprises a plurality of micro-nano protrusions (9) arranged on the inner wall of the cooling pipeline (8), and the micro-nano protrusions (9) are arranged at equal intervals along a circumferential direction of the cooling pipeline (8), and the micro-nano protrusions (9) are staggered along an axial direction of the cooling pipeline (8);
   arrangement angle directions of two adjacent micro-nano protrusions (9) are opposite;
   also comprising:
   a connecting pipeline, wherein the connecting pipeline is arranged at the outer side of the platform body (1), and both ends of the connecting pipeline are installed on the cooling pipeline (8) through a three-way valve (16); the connecting pipeline is provided with a unidirectional hydraulic pump II (15), and the unidirectional hydraulic pump II (15) is arranged in parallel with the unidirectional hydraulic pump I (14);
   a temperature measuring component, wherein the temperature measuring component is arranged on the cooling pipeline (8) at an outlet end of the platform body (1), and the temperature measuring component is used for measuring temperature of the cooling medium in the cooling pipeline (8); and
   a control motor (7), wherein the control motor (7) is used for controlling opening and closing and the flow direction of the three-way valve (16), and the temperature measuring component is electrically connected with the control motor (7);
   the micro-nano protrusions (9) are foam metal;
   the cooling pipeline (8) arranged in the platform body (1) has a serpentine structure;
   the outer heat dissipation device comprises a heat dissipation pipeline, both ends of the heat dissipation pipeline are communicated with the cooling pipeline (8); and an evaporator (6), a compressor (2), a condenser (3) and an expansion valve (4) are sequentially arranged on the heat dissipation pipeline along a circulating direction of the cooling medium; and the heat dissipation pipeline at an outlet end of the expansion valve (4) is connected with the cooling pipeline (8) through the evaporator (6).

2. The chip cooling platform based on micro-nano structure according to claim 1, wherein the temperature measuring component is a thermometer (5).

3. The chip cooling platform based on micro-nano structure according to claim 1, wherein the platform body (1) comprises:

wallboards (10); and heat-conducting components, wherein the heat-conducting components are fixedly installed on inner walls of the wallboards (10), the heat-conducting component comprises a heat dissipation thin plate (11), a T4 copper plate (12) and heat-conducting silicone grease (13) in sequence, and the cooling pipeline (8) is arranged between two groups of heat-conducting components, and the cooling pipeline (8) is in contact and fit with the heat dissipation thin plate (11).

* * * * *